US 007436728B2

(12) United States Patent
Harrand et al.

(10) Patent No.: US 7,436,728 B2
(45) Date of Patent: Oct. 14, 2008

(54) FAST RANDOM ACCESS DRAM MANAGEMENT METHOD INCLUDING A METHOD OF COMPARING THE ADDRESS AND SUSPENDING AND STORING REQUESTS

(75) Inventors: Michel Harrand, Saint Egreve (FR); Joseph Bulone, La Buissiere (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/594,689

(22) Filed: Nov. 8, 2006

(65) Prior Publication Data
US 2007/0186030 A1 Aug. 9, 2007

Related U.S. Application Data

(63) Continuation of application No. 10/668,060, filed on Sep. 22, 2003, now abandoned, which is a continuation of application No. 10/075,001, filed on Feb. 13, 2002, now abandoned.

(30) Foreign Application Priority Data

Feb. 13, 2001 (FR) .................................. 06 01934

(51) Int. Cl.
*G11C 7/00* (2006.01)
(52) U.S. Cl. .......................... 365/222; 711/106; 711/5
(58) Field of Classification Search ................. 365/222, 365/230.03, 189.04, 240.03; 711/106, 5, 711/105, 150
See application file for complete search history.

(56) References Cited

U.S. PATENT DOCUMENTS

| 4,914,575 | A | * | 4/1990 | Kihara et al. ................ 711/157 |
| 4,937,791 | A | | 6/1990 | Steele et al. |
| 5,175,832 | A | | 12/1992 | Keryvel et al. |
| 5,574,876 | A | | 11/1996 | Uchiyama et al. |
| 5,767,858 | A | | 6/1998 | Kawase et al. |

(Continued)

FOREIGN PATENT DOCUMENTS

GB          2 348 995        10/2000

(Continued)

OTHER PUBLICATIONS

French Search Report from French Patent Application 01/01934, filed Feb. 13, 2001.

*Primary Examiner*—Hong Kim
(74) *Attorney, Agent, or Firm*—Lisa K. Jorgenson; James H. Morris; Wolf, Greenfield & Sacks, P.C.

(57) ABSTRACT

A method to manage fast random access of a DRAM memory is described. The method includes steps of: dividing the memory into memory banks accessible independently in read and write mode; identifying the address of the bank concerned by a current request and comparing the address of the bank concerned by a current request with the addresses of the N−1 banks previously requested. N is an integral number of cycles necessary for executing a request. If the address of the bank concerned by a current request is equal to the address of a bank corresponding to one of the N−1 previous requests, then the method further includes steps of suspending and memorizing the current request until the previous request involving the same bank is executed, otherwise the current request is executed.

14 Claims, 7 Drawing Sheets

U.S. PATENT DOCUMENTS

| | | | |
|---|---|---|---|
| 5,774,409 A * | 6/1998 | Yamazaki et al. | 365/230.03 |
| 5,870,572 A | 2/1999 | Garcia | |
| 6,078,986 A | 6/2000 | Uchiyama et al. | |
| 6,134,169 A | 10/2000 | Tanaka | |
| 6,229,752 B1 | 5/2001 | Ayukawa et al. | |
| 6,260,107 B1 | 7/2001 | Uchiyama et al. | |
| 6,370,073 B2 * | 4/2002 | Leung | 365/222 |
| 6,560,155 B1 * | 5/2003 | Hush | 365/222 |
| 6,741,256 B2 | 5/2004 | Emberling | |
| 2002/0029364 A1 | 3/2002 | Edmonston et al. | |

FOREIGN PATENT DOCUMENTS

| | | |
|---|---|---|
| JP | 03183094 | 8/1991 |

* cited by examiner

FAST RANDOM ACCESS DRAM MANAGEMENT METHOD INCLUDING A METHOD OF COMPARING THE ADDRESS AND SUSPENDING AND STORING REQUESTS

CROSS REFERENCE TO RELATED APPLICATIONS

This application is a continuation of U.S. application Ser. No. 10/668,060, filed Sep. 22, 2003, now abandoned, which in turn is a continuation of U.S. Ser. No. 10/075,001, filed Feb. 13, 2002, now abandoned, entitled FAST RANDOM ACCESS DRAM MANAGEMENT METHOD, which prior applications are incorporated herein by reference in their entirety.

BACKGROUND OF THE INVENTION

1. Field of the Invention

The present invention relates to the management of a DRAM.

2. Discussion of the Related Art

It is generally known that, when a memory with a very fast access is desired, an SRAM is used. However, such a memory takes up a relatively large surface area since from 6 to 8 transistors are necessary to form an elementary memory cell.

Conversely, DRAMs have surface areas that can be much smaller, each elementary cell essentially including one transistor and one capacitive element.

However, it is often desired to form a memory having both the small surface area of a DRAM and the fast access features of an SRAM. It is for example desired to form a 144-Mbit single-chip memory with a possibility of access at each cycle of a clock having a 6.4-ns period (frequency on the order of 150 MHz).

The basic limitation of a DRAM is that the read or write access time of such a memory takes up several clock cycles, typically four clock cycles. This, essentially to take into account phases of preloading before each reading or writing of data and of rewriting after each reading of data, as well as to take into account relatively long switching times of the sense amplifiers of such a memory due to the low available signal level.

Figure 1:
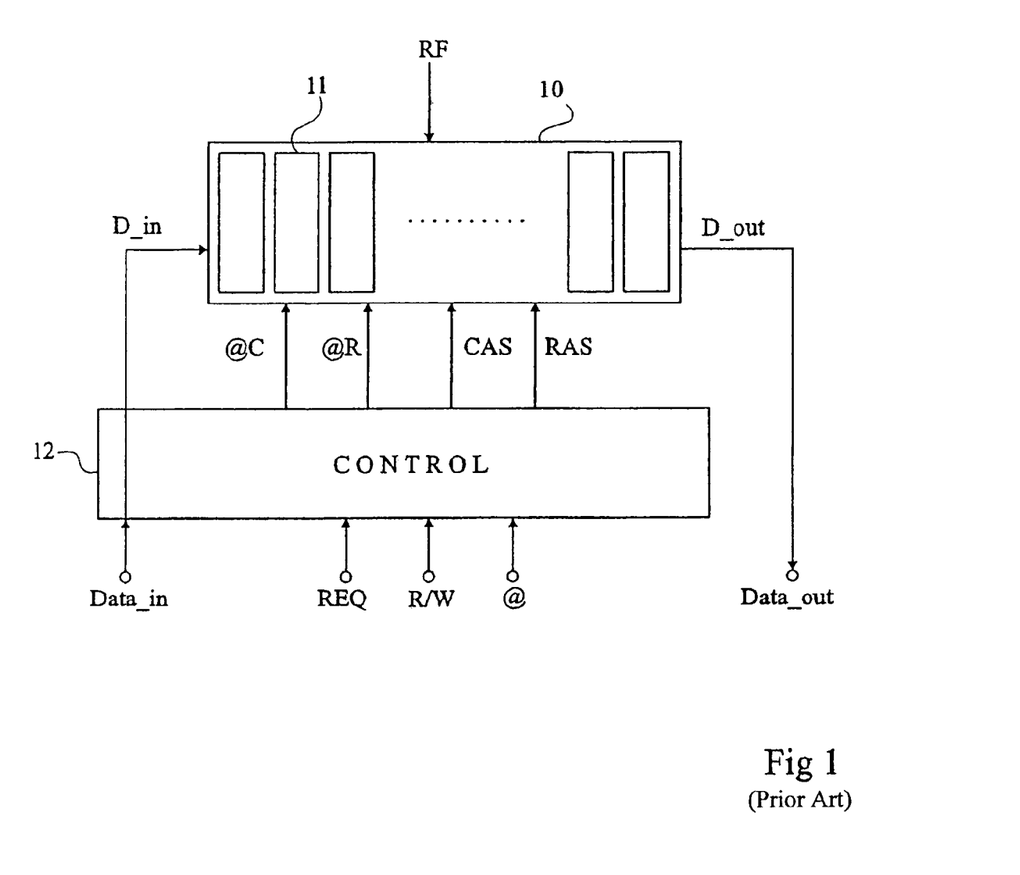
FIG. 1 illustrates a possible organization of a DRAM associated with a controller.

The general diagram of a system using a DRAM via a memory controller is very schematically illustrated in FIG. 1.

A DRAM 10 includes a great number of elementary blocks 11 and must be associated with read and write decoders (not shown). When a user (or a user program) desires access to memory 10, it must provide at least four indications:

a R/W indication indicating that it desires to read from or write into the memory, an address indication @ to indicate to which memory cell it desires access, an indication Data_in or D_in of the data that it desires to write (when it requires access in write mode), and a request signal REQ to validate the access order.

When the memory access is an access in the read mode, data will be provided over an output bus Data_out or D_out.

Further, the memory must be periodically refreshed and receives a refresh control signal RF.

Indications R/W, @, REQ, and D_in are provided to a control block 12, which transmits the data to be written and which turns the input data essentially into data enabling access to a row (RAS or Row Access Strobe), data enabling access to a column (CAS or Column Access Strobe), row address data (@R), and column address data (@C).

Further, the memory must be periodically refreshed and receives a refresh control signal RF.

In fact, a row addressing is first performed, which operation takes some time. Then, once on a given row, it is possible to have access at the clock rate to various elements in the same row. This property is often used to enable fast access to DRAMs by properly gathering the input data according to the expected outputs, so that these data are preferentially successively located on a same line (so that the searched words are on a same page).

The case where the positions of the data to which access is successively desired are fully random and in which it is not possible to previously gather these data in a same page is here considered. Such is the case, for example, in communication applications on fast communication networks such as the Internet.

SUMMARY OF THE INVENTION

Thus, an object of the present invention is to provide a management mode with fast access in the read and write mode of a DRAM, compatible, in particular, with the case where the positioning in the memory of successive data is completely random, that is, where it is not possible to arrange the data and/or the read and write control signals in advance in the memory so that the successive data to which access is desired are located in a same page (on a same row). The present invention also aims at a memory architecture allowing such a management mode.

To achieve this object and others, the present invention provides a method of fast random access management of a DRAM-type memory, including the steps of:

dividing the memory into memory banks accessible independently in read and write mode;

identifying the address of the bank concerned by a current request;

comparing the address of the bank concerned by a current request with the addresses of the N−1 banks previously required, N being an integral number of cycles necessary to execute a request; and if the address of the bank concerned by a current request is equal to the address of a bank corresponding to one of the N−1 previous requests, suspending and storing the current request until the previous request involving the same bank is executed, otherwise, executing it.

According to an embodiment of the present invention, the suspension operation includes stacking the requests in a memory of first-in/first-out type.

According to an embodiment of the present invention, for the data reading, the method further includes the steps of:

storing in an output FIFO register the data read during the first M cycles of memory use; and providing an output datum of the FIFO register, M cycles after each read request.

According to an embodiment of the present invention, the memory is periodically refreshed line by line and bank by bank, and the method includes the step of comparing the address of the bank to be refreshed with the addresses of N−1 ongoing requests and of the N following requests and delaying the refreshment if the address of the bank to be refreshed corresponds to one of the bank addresses of the 2 N−1 requests.

According to an embodiment of the present invention, the method includes the steps of resuming the refreshment and interrupting the request succession after a determined number of refresh cycle interruptions have occurred.

According to an embodiment of the present invention, the method includes the steps of:

storing N requests following the current request;

if the execution of the current request is suspended, executing one of the following requests not in conflict with the request being executed; and if the executed request is a read request, arranging back the read information in the order of the executed read requests.

According to an embodiment of the present invention, the memory banks are distributed into sets accessible in parallel, whereby each set statistically only needs to process half of the requests.

According to an embodiment of the present invention, the memory banks are distributed into several groups, the banks of a same group sharing the same bus, and two requests can be simultaneously transmitted to two distinct groups.

The foregoing objects, features and advantages of the present invention, will be discussed in detail in the following non-limiting description of specific embodiments in connection with the accompanying drawings.

DETAILED DESCRIPTION

Figure 2:
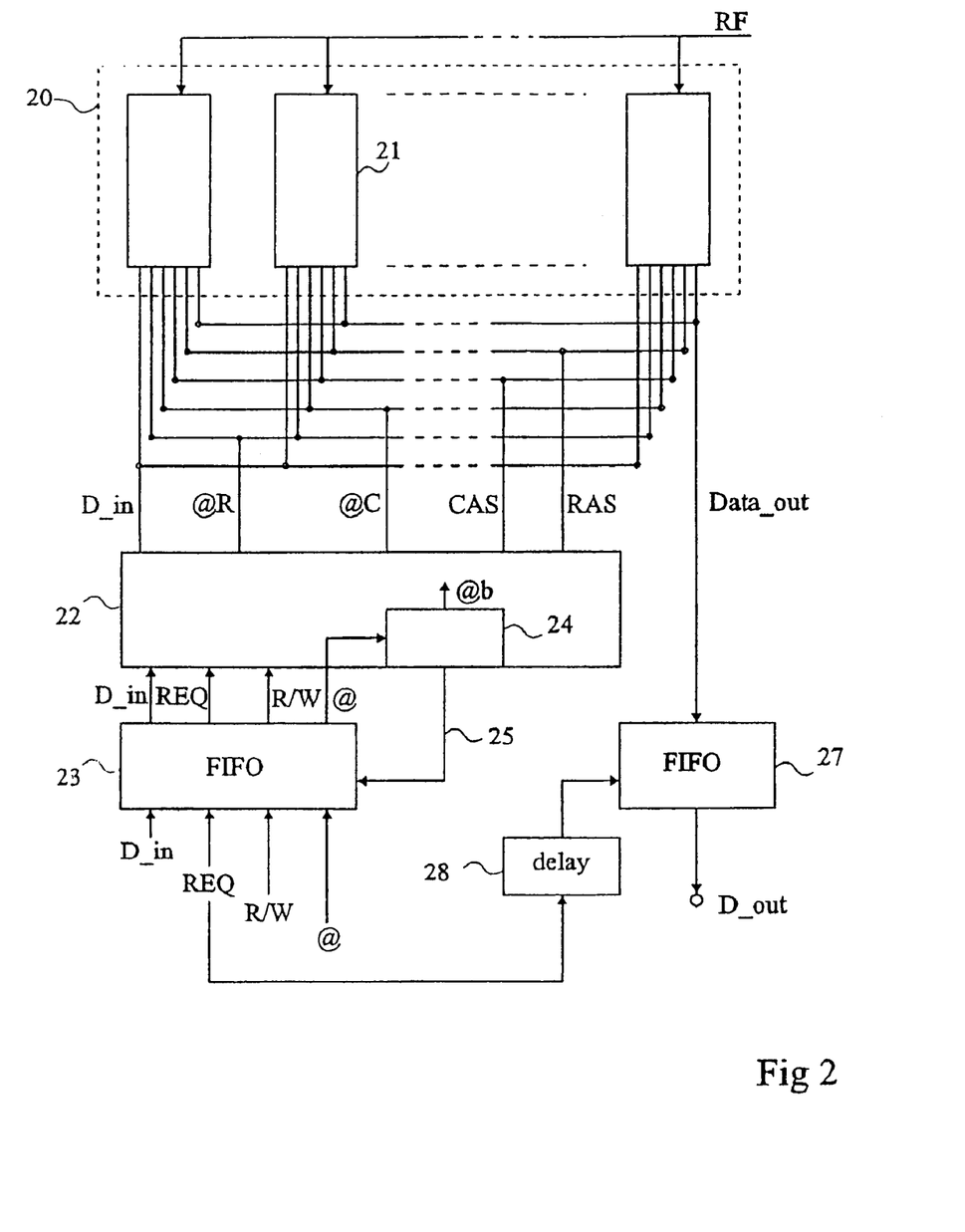
FIG. 2 illustrates the organization of a DRAM according to the present invention.

As illustrated in FIG. 2, a DRAM-type memory 20 according to the present invention is divided into a great number of memory cell banks, each bank 21 being associated with an address decoder (not shown), that is, each block is coupled with a data input bus Data_in, with a data output bus Data_out, with a row address validation input RAS, with a column address validation input CAS, with a row address input @R, and with a column address input @C. The bus control signals are provided by a controller 22 which receives signals D_in, REQ, R/W, and @ from a user or a user program via a FIFO-type register 23.

Controller 22 includes a block 24, intended for determining from an input address @ to which bank 21 the corresponding memory cell belongs, to couple the above-mentioned buses to this bank. This address is called a bank address and each input address is split up into a bank address @b, and into a row address @R and a column address @C within the determined bank.

According to the present invention, block 24 is further used for, when a new address is required by the user, comparing the address of the involved bank to the N−1 preceding bank addresses, N being the number of cycles required to execute a read or write instruction. Comparison output 25 is sent back to FIFO register 23 to block therein the last instruction and the next instructions as long as the bank address located at the top of the FIFO register cannot be processed.

FIFO register 23 should have a sufficient size to contain successive instructions to form a buffer in the case where several instructions designating banks already used are sent in a row. For example, if ten instructions concerning the same bank are sequentially sent, and the processing duration of an instruction is four cycles, the buffer should contain thirty successive instructions.

It should be understood that the FIFO register will empty back each time no instruction is sent in a cycle, which is currently designated by computerists as the sending of a no-operation instruction (Nop).

In fact, FIFO register 23 can have a relatively limited size since, if the memory is for example divided up into 64 blocks and the processing duration of an instruction is four cycles, the probability for an access to fall in an already unoccupied bank is (1−3/64)100=95%.

Figure 3:
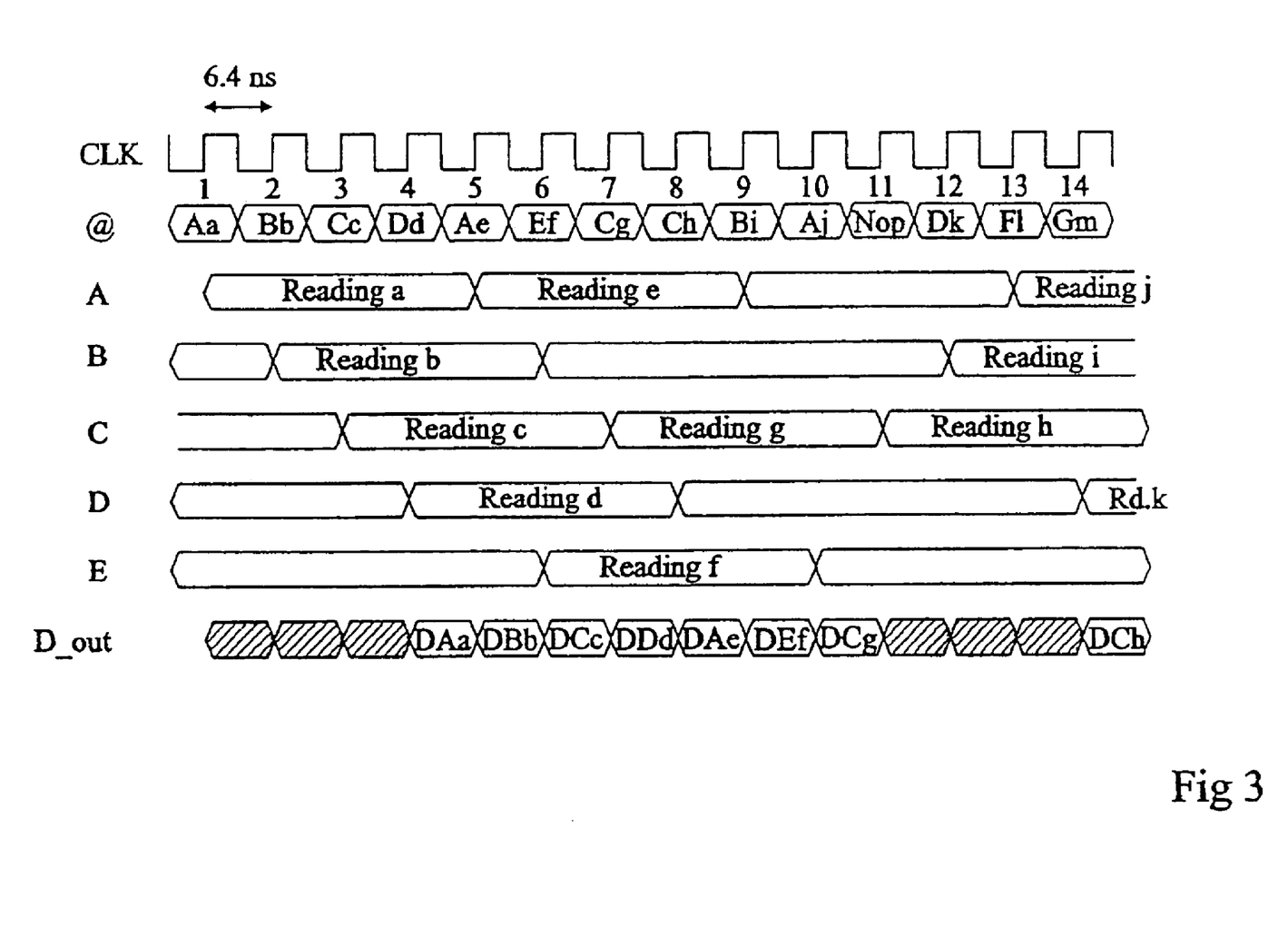
FIG. 3 is a timing diagram illustrating the management method according to the present invention.

The way in which a memory according to the present invention operates is better illustrated in relation with FIG. 3. The first line shows clock pulse cycles numbered from 1 to 14. The second line shows the aimed address @, the first (capital) letter indicating the address of a bank, and the second (small) letter indicating the address of a cell within a bank. The next lines show the states of five memory banks A, B, C, D, E in which readings are to be performed. The last line shows output data D_out. Readings are assumed to be successively required at addresses Aa, Bb, Cc, Dd, Ae, Ef, Cg, Ch, Bi, Aj, Nop (no operation), Dk, Fl, Gm.

At the first clock cycle, address Aa is required and the reading at address a of bank A starts. Bank A is occupied by this reading at address a for four cycles.

At the second cycle, a reading is started in bank B.

At the third cycle, a reading is started in bank C.

At the fourth cycle, a reading is started in bank D.

At the fifth cycle, address e is desired to be read from, again in bank A. This is possible since four cycles have elapsed since address a has been fetched in bank A. Bank A is thus available and the reading from address e starts in bank A.

At the sixth cycle, a reading is started at address f of bank E.

At the seventh cycle, a reading is started at address g of bank C.

A problem arises at cycle 8 where address h of bank C is requested while address g of bank C has already been requested at cycle 7. The system operation is then suspended and the reading from address h of bank C only starts at cycle 11 (three cycles after the time when this reading has been requested). During this time, the requests are stored in FIFO 23.

Then, in the given example, the other operations in bank A, bank D, bank F, then bank G occur with no difficulty. It should be noted that at cycle 11, no operation has been requested, which is designated by indication Nop. Thus, at cycle, 11, while the reading from address h of blank C is started, three instructions are stored in FIFO register 23 but, due to the fact that at this cycle, no instruction has been requested, only two instructions will be stored.

Line D_out shows that at the end of cycle 4, datum DAa is read. Data DBb, DCc, DDd, DAe, DEf, and DCg are then successively obtained on terminal D_out. But only four cycles after the reading of datum DCg can datum DCh be read since successive instructions for reading from bank C have arrived at cycles 7 and 8.

Thus, the provision of read/write decoders associated with each of the DRAM banks, in association with FIFO register 23, enables providing the DRAM according to the present invention with one read or write instruction per clock cycle, the execution of the instructions being suspended if several requests are addressed to the same bank. As mentioned, this does not result in the input FIFO latch indefinitely filling up since it empties again each time, during a clock cycle, no request (Nop) is addressed.

This is the first object of the present invention. However, the present invention provides other aspects enabling further improvement of the system operation.

In the case where sequences of access to data of a same bank should frequently be encountered, that is, a case of not really random access, the bank address may be provided to be transformed by a combination of address bits obtained by means of XORs to obtain "pseudo-random" address sequences.

1. Obtaining of a Constant Latency

In some applications, the length of the delay between a request for reading from the memory and an output of the read data matters little. What matters is that the read data are sequentially output at the rate at which they have been requested. For this purpose, the present invention provides adding a FIFO-type register 27 (FIG. 2) to the data output. This register is first filled. It will then empty at the clock rate while new read data will fill it. A device linking the input FIFO register with the output FIFO register ensures that the output FIFO register provides an output with an interval of a number of clock pulses after a read request, but that the output is inhibited if no read instruction is sent as an input at the request corresponding to this delay. For this purpose, it will be enough to provide in association with each request signal a validation of the output FIFO register with a delay corresponding to the number of initial register filling cycles. This shifting is illustrated in FIG. 2 by a (delay) block 28.

2. Refreshment Mechanism

A DRAM-type memory requires periodically performing a refresh operation on each cell or rather on each row. This has the disadvantage that there can be a conflict between the ongoing refreshment and a requested read or write request. The present invention provides a solution to solve this conflict without loosing any cycle time.

For this purpose, the present invention provides arranging at the input of the control circuit, at the output of FIFO register 23, a shift register.

Figure 4:
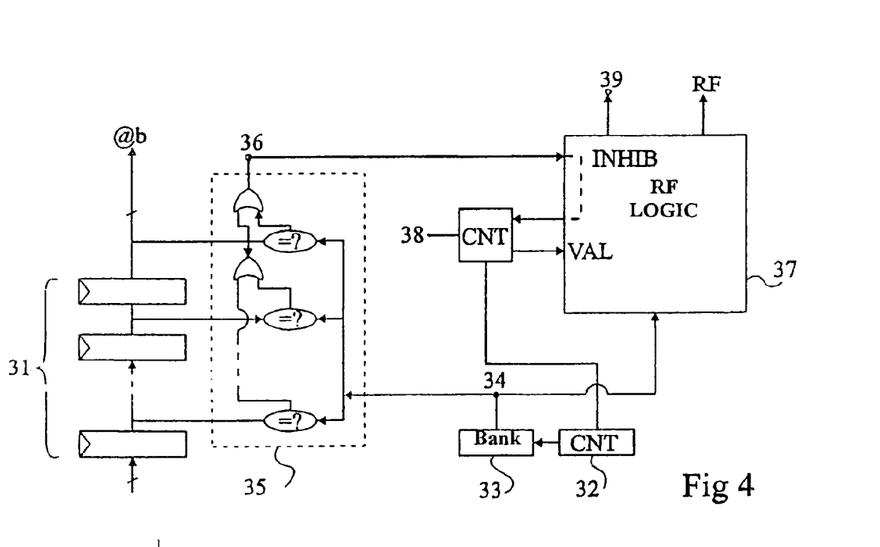
FIG. 4 illustrates an alternative implementation of the method according to the present invention.

In FIG. 4, this shift register is designated by reference 31 and for example includes 2 N–1 stages if the execution time of an instruction is N clock cycles. This register will, in particular, include the addresses of the banks corresponding to the successive requests.

The refreshment is determined by a counter 32, which increments a bank number 33 and a page number to provide bank addresses RFbank and page addresses RFpage to be refreshed. The bank number accessible over a bus 34 is compared by a comparator 35, output 36 of which indicates whether the bank number which is desired to be refreshed is one of the banks under addressing or to be addressed during the next N cycles. If the output indicates that there is a coincidence, a logic refresh block 37 receives a signal for inhibiting the refreshment (INHIB). The refreshment is then suspended as long as the conflict remains. When the request of a bank posing a problem is executed, the refreshment resumes and a refreshment request RF is provided by logic block 37.

Further, the system includes a safety mechanism for avoiding for the refreshment to be interrupted for too long a period if ever the conflict would remain for too long, that is, if several successive requests were addressed to the bank which is desired to be refreshed at the considered time. This safety system includes a counter 38 which is started at the rate of counter 32 as soon as a signal INHIB appears. When counter 38 reaches a predetermined count corresponding to the maximum duration for which it is tolerable to interrupt a refreshment, a validation signal VAL is provided to logic circuit 37 and this block provides a signal 39 which interrupts the progress of the system and of the various pipelines to carry out the refreshment. The read/write operations are resumed after the refreshment has been performed.

Figure 5:
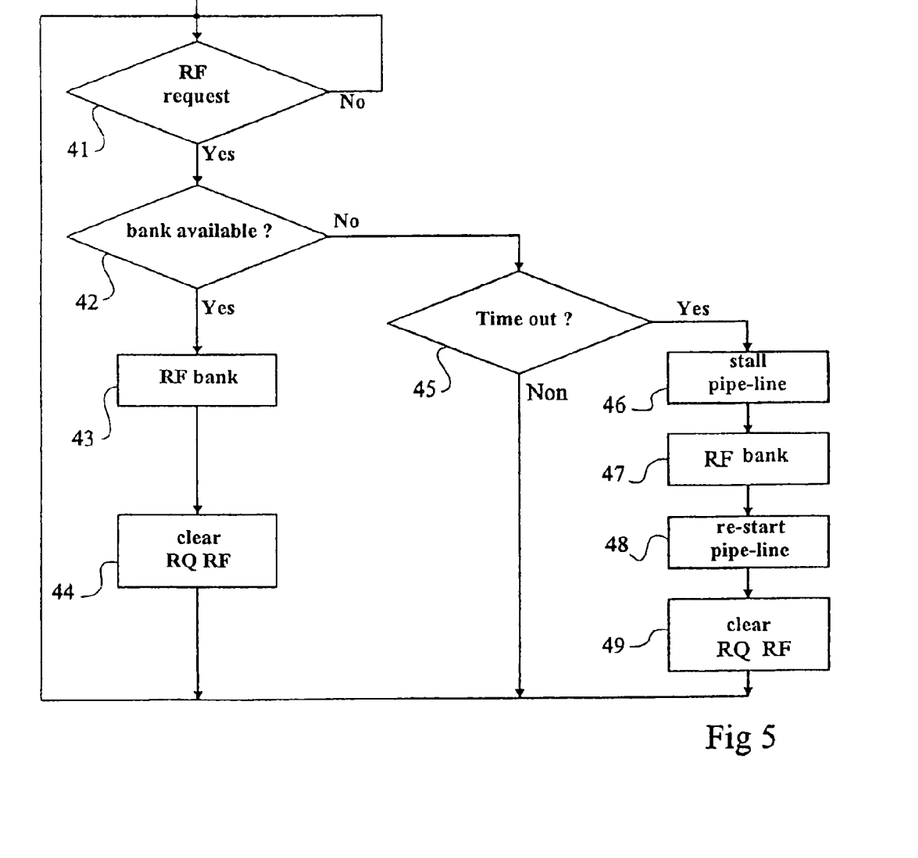
FIG. 5 is a timing diagram illustrating the operation of the device of FIG. 4.

Thus, logic block 37 associated with counter 38 performs the following operations illustrated in FIG. 5. At an initial step 41, it is checked whether a refreshment request (RF) comes from counter 32. If so, at 42, it is checked whether the bank to be refreshed is available. If so, the refreshment is carried out at 43 then, at 44, the refreshment request is deleted and the system returns to step 41. If, at step 42, a signal INHIB is seen to be present, that is, the bank to be refreshed is not available, counter 38 is started at 45. If the counting of this counter has not reached a determined threshold, the loop returns to step 41. If the counting has expired, the processing logic system provides, at step 46, on an output 39, an order for interrupting the pipeline, that is, the memory request process is interrupted. At step 47, the considered bank is refreshed. At step 48, the pipeline is started again. At step 49, the refreshment request is interrupted, after which the system returns to step 41. Logic block 37 may be a programmed logic wired circuit.

3. Execution in Disorder of Memory Access Requests

Referring to the timing diagram of FIG. 3, it can be seen that, at cycle 8, when request Ch, non immediately executable, is called, this request is followed by requests Bi and Aj which could be immediately executed, blocks B and A being free at the times when these requests appear.

According to an aspect of the present invention, it is provided to immediately start the execution of requests B and A at the time when the appear, then to start the execution of the request in bank C only afterwards. Of course, to avoid for this to disturb the system at the output level, a reorganizing register, which will receive the information according to which the input request execution order has been modified, to output them in their request order, is provided.

Figure 6:
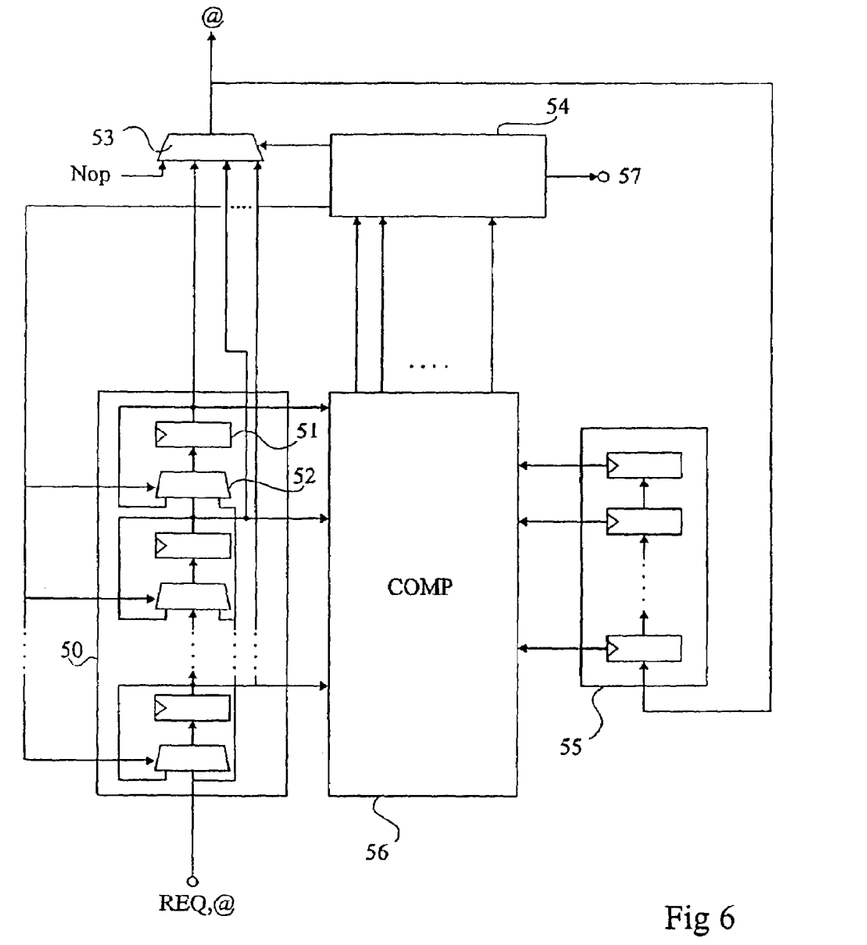
FIG. 6 shows another alternative embodiment of the present invention.

The system shown in FIG. 6 stores in a register 50 the Q requests which follow the last request to be executed. These requests are placed in register 51 in their order of arrival according to the normal operating mode of a shift register. In register 50, a multiplexer 52 is arranged upstream of each of stages 51. Stages 51 and multiplexers 52 are connected so that the output of any one of stages 51 can be selected by a multiplexer 53, the output of which enables control of the execution of the corresponding request. Multiplexers 52 and 53 are controlled by a logic block 54.

A register 55 receives the output of multiplexer 53 and stores the N requests under execution. It is checked in a block of Q×N comparators 56 (similar to comparator 35 of FIG. 4) whether the content of each of the stages of shift register 50 corresponds to the content of one of the stages of register 55. This information is sent to logic block 54, which controls multiplexers 52 and 53 to successively execute the requests corresponding to the content of the stages of register 50 in the order of the first register having a content which does not correspond to a bank memorized in register 55. Logic circuit 54 conventionally ensures other functions necessary to the proper system operation and especially includes an output 57 for controlling the above-mentioned reorganizing register.

When a subsequent request is executed before a previous request which corresponds to an occupied bank, this request is eliminated from the pipeline. The unselected requests placed before that which have been selected remain in their position and the unselected requests placed after the selected request are shifted by one position unit of the pipeline. This is done by adequately controlling the multiplexers 52 arranged between each stage 51 of register 50. The design of a logic circuit 54 to implement these functions is within the abilities of those skilled in the art, who can obtain this result by wired circuit means or by a programmed logic.

The multiplexers associated with the control logic system also enable refilling the upper registers of the pipeline from the FIFO register in the case where the FIFO register has remained empty during some clock cycles because no request has been input.

The only case where a clock cycle cannot be used is that where the next Q accesses (including the current access) all involve used banks.

Thus, the probability of not being able to use a current cycle is equal to $[(N-1)/P]^Q$ and the probability of success is equal to $1-[(N-1)/P]^Q$.

4. Joint Use of Two Memories

Other DRAMs of the type previously described may be used together with half of the number of banks provided previously in each of these memories to keep an unchanged total capacity, by providing two input FIFO registers. In this case, in average, half of the requests is sent to each memory. This provides the possibility to easily empty the input FIFO register associated with each of the memories in the case where it has started to fill up. Thus, the rapidity or bandwidth of the system is doubled. More specifically, the usable bandwidth of each memory becomes that corresponding to half the number of banks and the bandwidth of the general memory is double.

5. Two-Input Memory

The system described hereabove only operates if the memory bandwidth is not used at 100%, that is, if sometimes no request (Nop) is encountered. Otherwise, the FIFO register would fill up in the long run. The improvement described hereafter enables the system to operate even if a valid request is present at each clock cycle (no Nop). The principle is that the input FIFO register is enabled to empty faster than it fills up by executing, when possible, two memory accesses per clock cycle. This improvement enables reducing the data loss factor to less than $10^{-10}$ per cycle.

According to another improvement of the present invention, the memory is divided into several bank groups. The banks in a same group share the same bus. Each group uses a different bus than the other groups. The system could operate, actually more efficiently, with one block per group, but the bus routing would then occupy a very large surface area. The dividing into bank groups is thus chosen according to an efficiency/surface area compromise. A control system enables executing two accesses in parallel, provided that the accesses belong to different bank groups. The system uses a mechanism similar to that described at point 2 hereabove in relation with a refreshment mechanism to select two requests in the pipeline from among the requests which do not use an already-used bank. The selection of the second access uses, in addition to the already-described criteria, the fact that the second access must not be in the same bank group as the first one. The entire control system uses a clock with a double frequency to read two requests from the FIFO register while one request is introduced.

The memory is shared into G bank groups. The different banks in a group share the same address and data buses.

Two different banks can be simultaneously addressed if and only if they do not belong to the same group (a single bus per group). The more groups there are, the more interconnections are required, but the more probable it is to be able to perform two accesses in parallel.

For example, a 32-bank memory may be organized in two groups of sixteen banks, in four groups of eight banks, or in eight groups of four banks. The organization in four groups of eight banks will probably be the best compromise between performance and complexity (number of interconnections).

Figure 7:
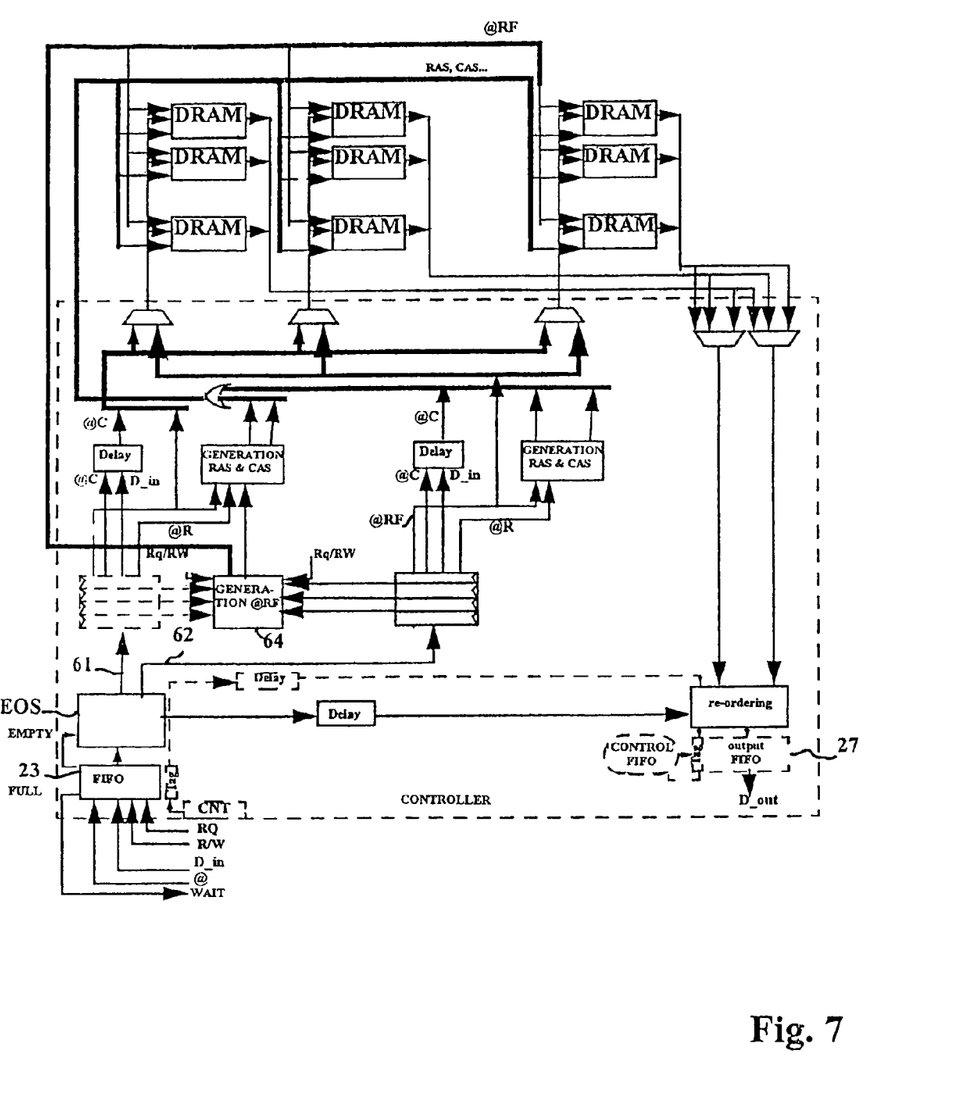
FIG. 7 shows another alternative embodiment of the present invention.

As illustrated in FIG. 7, the memory access requests are stored in input FIFO register 23 at each main clock cycle (frequency F). A logic execution order selection circuit (EOS), more specifically shown in FIG. 8 and rated at frequency 2 F by a secondary clock, reads at most two requests from the FIFO register as long as the FIFO register is not empty and that there is enough room in its Q request registers.

Figure 8:
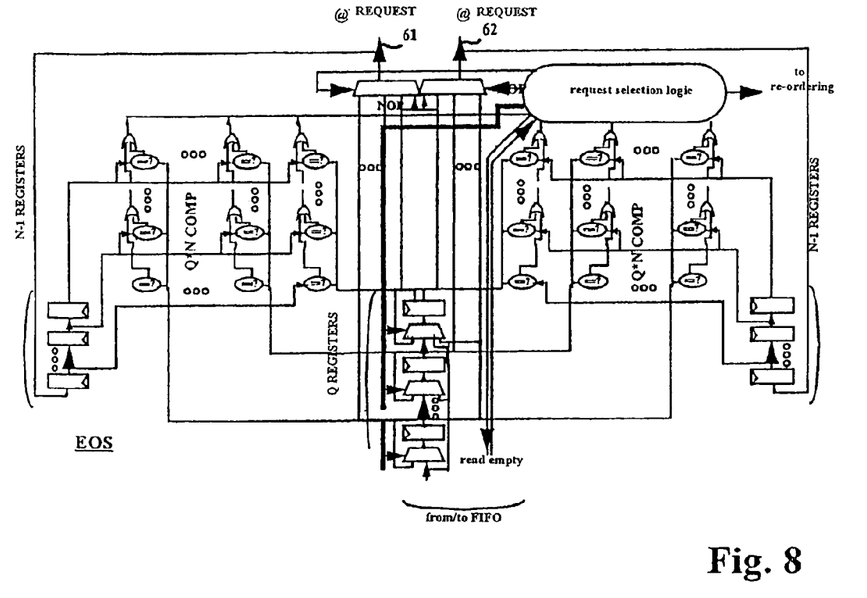
FIG. 8 shows another alternative embodiment of the present invention.

At the system initialization, assuming that an access request is input in the FIFO register at each main clock cycle, the EOS reads a request from the FIFO register at each main cycle (it cannot read two, since the FIFO register is emptied each time it reads a request) and stores it in one of the Q registers.

Multiplexers between the pipeline register enable the EOS to directly fill the registers of higher level from the FIFO register to avoid having to wait for several clock cycles to refill the pipeline when the FIFO register has been emptied due to the absence of any request. These multiplexers also enable eliminating from the pipelines a request which has been selected (this has been previously described in relation with register 51 of FIG. 6).

The EOS includes two request outputs 61 and 62 to simultaneously execute two accesses in the memory. For each of them, at each main clock cycle, the EOS selects one request from the Q requests present in the registers. For this purpose, the bank addresses of all the Q requests are compared with the bank addresses of all the requests currently processed. The maximum number of these current requests is equal to 2(N−1), given that a request is executed in N cycles and that two requests can be simultaneously executed.

Upon initialization or at the first request executed after the EOS pipeline has been deleted, the content of the 2(N−1) register is invalidated.

The request selection algorithm executed by the EOS control logic circuit as concerns its left-hand output 61 is the following:

if the bank address of the request placed at the top of register Q is not equal to the address of any one of the current accesses, this request is selected to be output to the left;

otherwise, if the condition is satisfied for the next one of the Q registers, this request is selected, and so on;

otherwise, if the condition is satisfied for the last one of the Q registers, this request is selected;

otherwise, no request is selected in this main clock cycle.

The request selection algorithm executed by the EOS logic control circuit for its right-hand output 62 is identical, except that the following condition is added to the condition that the request does not involve a bank already under use:

the request chosen for the right-hand output must not address a bank of the same group as that which is addressed by the left-hand output.

Each of the two outputs of the EOS is sent to refreshment generation block 64, which selects banks that can be refreshed and the time when it should be done without interfering with the memory accesses, as discussed previously. Then, the requests are transferred to the memory after generation of signals RAS and CAS. Each output of the pipeline can be sent to any one of the G banks via the G multiplexers (it should be reminded that the EOS has selected its outputs so that they aim at distinct banks).

In most cases, the EOS can immediately execute all the requests which are read from the FIFO register so that the EOS will read a single request of the FIFO register at each main clock cycle instead of two, since the FIFO register will be emptied at each cycle.

When several consecutive (or almost consecutive) requests aim at the same block, in most cases, the EOS can reorganize these requests so that at least one request can be executed at each main clock cycle.

However, it may happen that the number of consecutive (or almost consecutive) requests involving the same block is too high (that is, greater than Q) to enable the EOS to find executable requests at each clock cycle. In this case, a single request for n clock cycles (n≦N) will be executed. Then, at a time, none of the Q registers will be free. The EOS will not be able to read a request from the FIFO register, and if incident requests keep on arriving, the FIFO register will fill up. However, this situation will last until the time when the requests address different banks again. Then, the EOS will be able to read and execute two requests from the FIFO register at each clock cycle. The FIFO register will then empty again and the normal activity of one request per cycle and of a single request in the FIFO register will be resumed.

The various elements of FIGS. 7 and 8 have only been briefly described. This has been done to make the description lighter. These drawings, which should be easily understood by those skilled in the art, will be considered as being an integral part of the present description.

Of course, the present invention is likely to have various alterations, modifications, and improvements which will readily occur to those skilled in the art, especially as concerns the sizes of the various banks.

The present invention may also apply to memories other than DRAMs operating with the same principle of execution of a request in several clock cycles.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of fast random access management of a DRAM memory, including the steps of:
   dividing the memory into memory banks accessible independently in read and write mode;
   identifying an address of the bank concerned by a current request;
   comparing the address of the bank concerned by a current request with addresses of N−1 banks previously requested, N being an integral number of cycles necessary to execute a request;
   if the address of the bank concerned by a current request is equal to the address of a bank corresponding to one of the N−1 previous requests, suspending and storing the current request until the previous request involving the same bank is executed, otherwise, executing the current request;
   refreshing the memory periodically line by line and bank by bank;
   comparing the address of the bank to be refreshed with addresses of N−1 ongoing requests and of N following requests;
   delaying the refreshing if the address of the bank to be refreshed corresponds to one of the bank addresses of 2N−1 requests; and
   resuming the refreshing and interrupting a succession of requests after a determined number of refresh cycle interruptions have occurred.

2. The method of claim 1, wherein the suspension operation includes stacking the requests in a first-in/first-out memory.

3. The fast access DRAM management method of claim 1, further including the steps of:
   storing read data in an output FIFO register; and
   providing an output datum of the FIFO register, M cycles after each read request.

4. The fast access DRAM management method of claim 1, wherein the memory banks are distributed into sets accessible in parallel, whereby each set statistically only needs to process half of the requests.

5. The fast access DRAM management method of claim 1, wherein the memory banks are distributed into several groups, the banks of a same group sharing the same bus, and wherein two requests can be simultaneously transmitted to two distinct groups.

6. The A method of fast random access management of a DRAM memory, including the steps of:
   storing N requests following the current request;
   if the execution of the current request is suspended, executing one of the following requests not in conflict with the request being executed; and
   if the executed request is a read request, arranging back the read information in the order of the executed read requests;
   refreshing the memory periodically line by line and bank by bank;
   comparing an address of a bank to be refreshed with addresses of N−1 ongoing requests and of N following requests;
   delaying the refreshing if the address of the bank to be refreshed corresponds to one of bank addresses of 2N−1 requests; and
   resuming the refreshing and interrupting a succession of requests after a determined number of refresh cycle interruptions have occurred.

7. A fast random access DRAM memory comprising:
   a plurality of memory banks accessible independently in read and write mode;
   means for comparing an address of a memory bank of the plurality of memory banks corresponding to a current request with addresses of memory banks of the plurality of memory banks corresponding to N−1 previous requests, N being an integral number of cycles necessary to execute a request;
   means for performing a refresh operation comprising refreshing the plurality of memory banks line by line and bank by bank; and
   means for comparing an address of a memory bank to be refreshed with addresses of memory banks corresponding to N−1 ongoing requests and addresses of memory banks corresponding to N following requests, and delaying the refresh operation if the address of the memory bank to be refreshed equals an address of at least one of the memory banks corresponding to the N−1 ongoing requests or the N following requests; and
   means for resuming the refresh operation and interrupting a succession of requests for a memory bank after the refresh operation has been delayed a predetermined number of times.

8. The fast random access DRAM memory of claim 7, further comprising:

means for identifying the address of the memory bank corresponding to the current request.

9. The fast random access DRAM memory of claim 7, further comprising:

means for, if the address of the memory bank corresponding to the current request is equal to an address of a memory bank corresponding to at least one of the N−1 previous requests, suspending and storing the current request until the at least one of the N−1 previous requests is executed, otherwise, executing the current request.

10. The fast random access DRAM memory of claim 9, further comprising:

means for storing N requests following the current request, and, if execution of the current request is suspended, executing a following request of the N following requests corresponding to a memory bank having an address not equal to an address of a memory bank corresponding to the N−1 previous requests.

11. The fast random access DRAM memory of claim 10, further comprising:

means for, if the executed request is a read request, arranging back the read information in the order of the executed read requests.

12. The fast random access DRAM memory of claim 7, further comprising:

means for storing read data; and means for providing an output datum, M cycles after each read request.

13. The fast random access DRAM memory of claim 7, wherein the memory banks of the plurality of memory banks are distributed into sets accessible in parallel, whereby each set statistically only needs to process half of the requests.

14. The fast random access DRAM memory of claim 7, wherein the memory banks of the plurality of memory banks are distributed into several groups, the memory banks of a same group sharing a same bus, and wherein two requests can be simultaneously transmitted to two distinct groups.

* * * * *

UNITED STATES PATENT AND TRADEMARK OFFICE
CERTIFICATE OF CORRECTION

PATENT NO.         : 7,436,728 B2                                        Page 1 of 1
APPLICATION NO. : 11/594689
DATED              : October 14, 2008
INVENTOR(S)        : Michel Harrand et al.

It is certified that error appears in the above-identified patent and that said Letters Patent is hereby corrected as shown below:

Col. 10, line 24 should read:
--6. A method of fast random access management of a--

Signed and Sealed this

Third Day of November, 2009

David J. Kappos
*Director of the United States Patent and Trademark Office*